United States Patent [19]

Dash

[11] Patent Number: 4,785,373

[45] Date of Patent: Nov. 15, 1988

[54] ELECTROSTATIC DISCHARGE SIMULATOR

[76] Inventor: Glen Dash, 201 Bingham Rd., Carlisle, Mass. 01741

[21] Appl. No.: 82,685

[22] Filed: Aug. 7, 1987

[51] Int. Cl.$^4$ .............................................. H01T 23/00
[52] U.S. Cl. ................................................... 361/235
[58] Field of Search ................................ 361/230, 235

[56] References Cited

U.S. PATENT DOCUMENTS 4,680,533 7/1987 Itani et al. ........................... 361/235

Primary Examiner—L. T. Hix
Assistant Examiner—David Porterfield
Attorney, Agent, or Firm—Wolf, Greenfield & Sacks

[57] ABSTRACT

An electrostatic discharge simulator employing the combination of a chargeable member connected in parallel with a parallel plate capacitor network. The chargeable member is maintained charged by a high voltage supply through a charging resistance. The capacitor network includes a bank of resistors and capacitors for providing a voltage step simultaneously with an ESD event and is detected by an event detector. The event detector turns off the high voltage supply. To charge the capacitances for the next event, the event detector is reset using a reset switch built into the device probe.

3 Claims, 4 Drawing Sheets

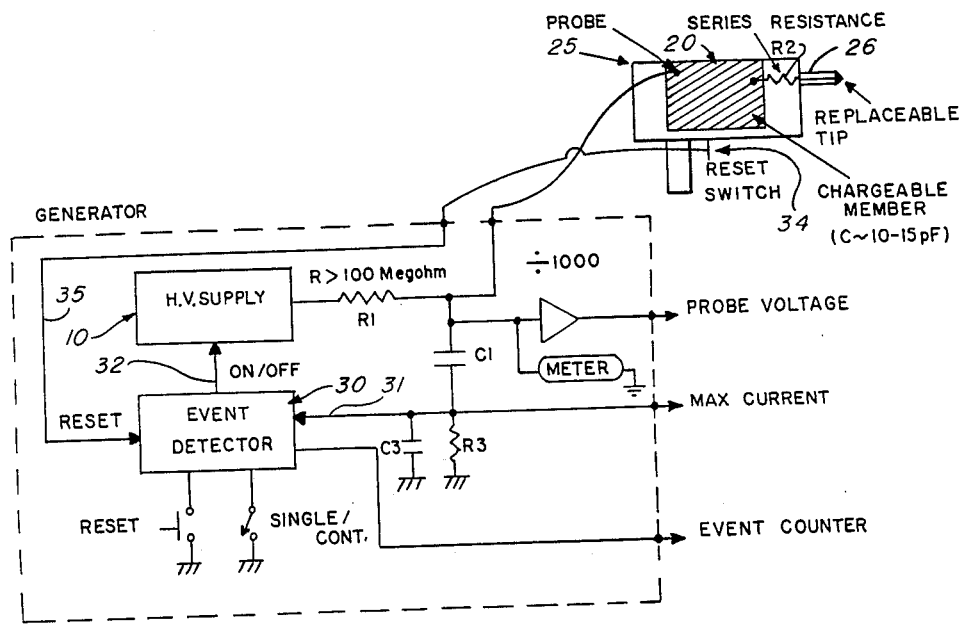
Fig. 7
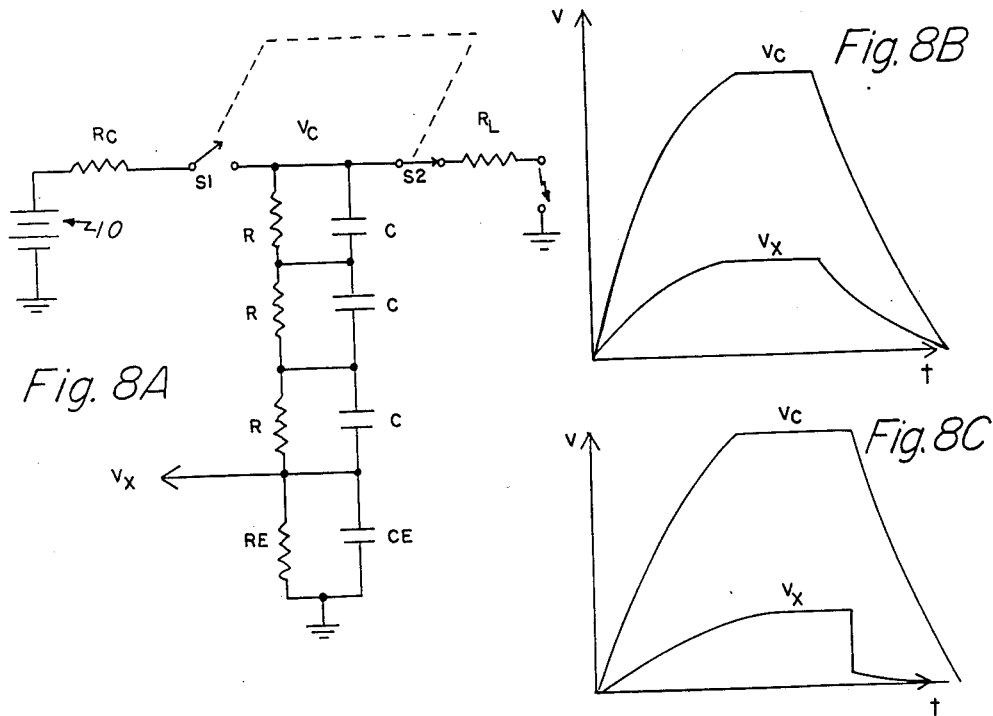
Fig. 8A
Fig. 8B
Fig. 8C

ELECTROSTATIC DISCHARGE SIMULATOR

BACKGROUND OF THE INVENTION

1. Field of the Invention

The present invention relates in general to an instrument that is adapted to simulate electrostatic discharge events caused by human beings in a home or office environment.

2. Background Discussion

Electrostatic discharge (ESD) events can disrupt or destroy sensitive electronic equipment such as personal computers, calculators, or home entertainment devices. The nature of such events has been observed by nearly everyone. A simple spark from a fingertip causes large changes in voltage and current. If the spark is coupled to sensitive electronic equipment, it can disrupt the operation of the equipment or furthermore cause destruction of the equipment.

Because of the effect of electrostatic discharge on electronic equipment, manufacturers have sought to test equipment before it is marketed using electrostatic discharge simulators. These simulators are intended to be designed to accurately replicate the ESD event so that, in a laboratory, computers and other equipment can be tested for their electrostatic discharge immunity characteristics. However, present electrostatic discharge simulators do not provide for an accurate replication of ESD events and furthermore are complex in construction, costly, and difficult to operate.

Accordingly, it is an object of the present invention to provide an improved electrostatic discharge simulator and one that in particular accurately replicates the ESD event.

Another object of the present invention is to provide an electrostatic discharge simulator that is relatively simple in construction, that can be manufactured relatively inexpensively and that is easy to operate.

SUMMARY OF THE INVENTION

In accordance with the invention, there is provided an electrostatic discharge simulator. In accordance with one aspect of the present invention this simulator is comprised of a high voltage source that is adapted to charge a parallel plate capacitor network. In this regard there is provided switch means including a first switch connecting the high voltage source in a series loop with the capacitor network for enabling charging of the capacitor network. The simulator also includes a chargeable member and a second switch along with a probe. Means are provided for connecting the second switch in series with the chargeable member between the parallel plate capacitor network and the probe. The second switch, upon closure, provides an output pulse at the probe which output pulse is adapted to simulate an ESD event.

In accordance with another aspect of the present invention, there is provided an electrostatic discharge generator that also employs a chargeable member connected in parallel with a parallel plate capacitor network. The chargeable member is kept continuously charged by high voltage supply through a charging resistance preferably greater than 100 megaohms. The capacitor network may comprise a bank of resistors and capacitors that provides a voltage step simultaneously with an ESD event, which step is independent of current. An event detector is employed to detect this voltage step and turn off the high voltage supply. To charge the capacitances for the next event, the event detector is reset using a reset switch built into the probe. The event detector may be in the form of a multiplicity of capacitors having resistors coupled in series therewith. These resistors, so as not to lower the output of the high voltage supply, are preferably higher than 1 gigaohm. To provide an event detection, one additional resistor and capacitor disposed in parallel is provided at a time constant greater than that of the rest of the network so as to provide a step event upon an electrostatic discharge. This step event is independent of current and can be detected by differentiation.

BRIEF DESCRIPTION OF THE DRAWINGS

Numerous other objects, features, and advantages of the invention should now become apparent upon a reading of the following detailed description taken in conjunction with the accompanying drawings, in which:

FIG. 7 is a block diagram of an alternate embodiment of the invention employing an event detector;

FIG. 8A shows one embodiment for the event detector of FIG. 7 while FIGS. 8B and 8C show associated waveforms; and

DETAILED DESCRIPTION

Figure 1B:
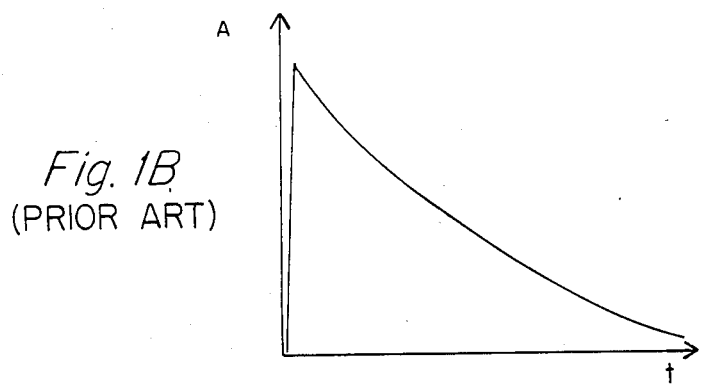
FIG. 1A illustrates a prior art RC circuit for ESD event simulation along with an associated waveform shown in FIG. 1B.
Figure 1A:
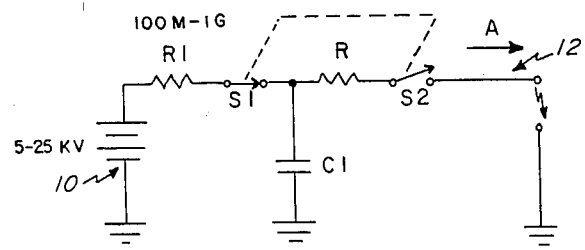

Reference is now made to FIG. 1A for an illustration of a simple RC circuit including resistor R1 and capacitor C1. Also illustrated in FIG. 1A is the high voltage source 10 and a probe illustrated schematically at 12. The capacitor C1 is charged to a voltage between 5,000 and 25,000 volts through a large resistance R1 on the order of 100 megaohms to 1 gigaohm. This charging occurs through a switch including switch contact S1. FIG. 1A also shows a second switch S2. It is noted in FIG. 1A that the switch S1 is closed and thus this is illustrating charging sequence.

Once charged, a second switch S2 is thrown which allows the capacitor to discharge through resistance R into the computer or other device via the probe 12. This causes a spark in the gap between the simulator's probe tip and the surface of the computer or other electronic device. The rise time of the waveform illustrated in FIG. 1B is usually limited to the speed of the formation of the spark itself. This may generally be under 1 nanosecond. On the other hand, the discharge time constant is a function of the values of resistor R and capacitor C1.

Considerable debate has surrounded the standardization of values of resistor R and capacitor C1. Currently, the International Electrotechnical Commission (IEC)

has settled on R and C1 values of 150 ohms and 150 picofarads, respectively [IEC 801-2 (1984)].

Figure 2A:
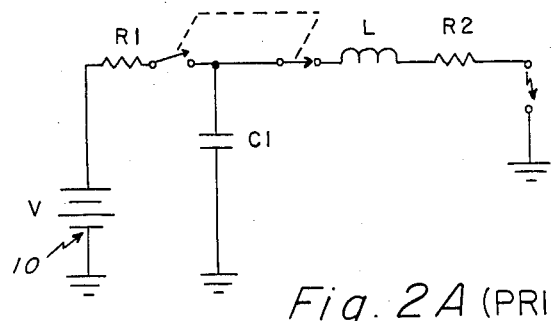
FIG. 2A illustrates a prior art RC circuit similar to that shown in FIG. 1.
Figure 3A:
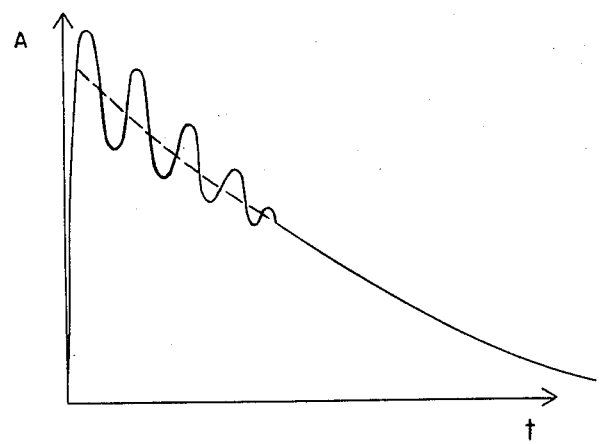
FIGS. 3A and 3B illustrate a waveform associated with the invention.
Figure 3B:
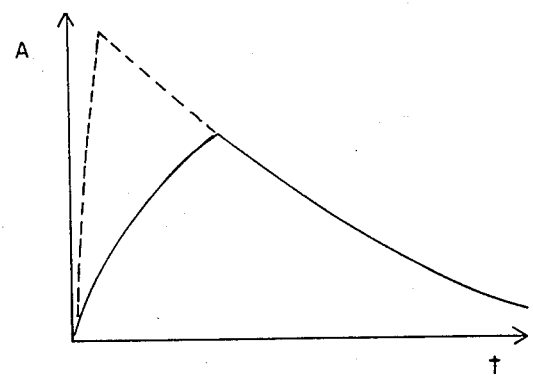

Providing a simulator that produces the waveform of FIG. 1B has proven to be difficult. The rise times are extremely fast, causing instrumentation difficulties. These difficulties are due, at least in part, to a stray inductance L as depicted in FIG. 2A. Depending upon the value of the inductance L, the actual waveform produced can either be complex as shown in FIG. 3A, or overdamped as illustrated in FIG. 3B. In actual practice, the value of the inductance L is difficult to control.

Usually, the probe tip of the electrostatic discharge generator is separated from its high voltage power supply by a length of cable up to several meters long. Even if the high voltage power supply is built into the probe tip, a ground return cable of equal length connects the simulator to an earth ground return. In either case, the inductance L exists and distorts the desired waveform.

Figure 2B:
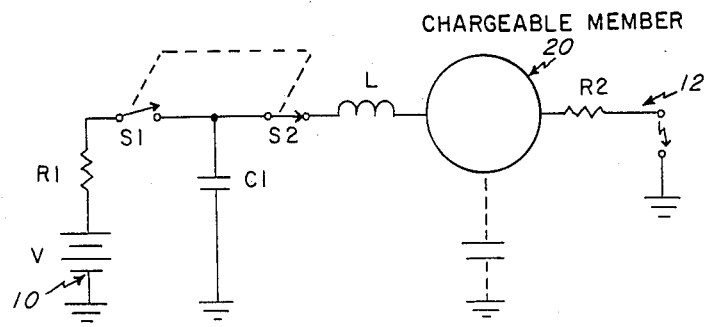
FIG. 2B is an electrostatic discharge simulator circuit in accordance with the invention employing a chargeable member.

Thus, in accordance with one aspect of the present invention, there is provided a means for producing a simulated waveform which can control the waveform to produce the desired shape which is the shape illustrated in FIG. 1B. The preferred means in accordance with the present invention is illustrated in FIG. 2B. It is noted that in FIG. 2B there is employed the addition of a chargeable member illustrated at 20. The chargeable member 20 is employed to essentially swamp the inductance L.

The circuit depicted in FIG. 2 thus includes a parallel plate capacitor C1 along with the switch contact S1 and S2. The capacitor C1 is charged through resistor R1 from the high voltage supply 10. On the discharge side of the capacitor, there is illustrated the inductance L along with the chargeable member 20 and the series resistance R2 coupling to the probe at 12.

The chargeable member is comprised of a metal sphere or may alternatively be in the form of a metal plate placed in the probe tip between the line from the power supply and its connection to resistor R2. The metal sphere or plate has a capacitance of its own, irrespective of its proximity to other metal objects. For metal spheres, this capacitance is approximately 100 picofarads per meter of radius. For metal plates, the capacitance is 30 picofarads per square foot.

Figure 5A:
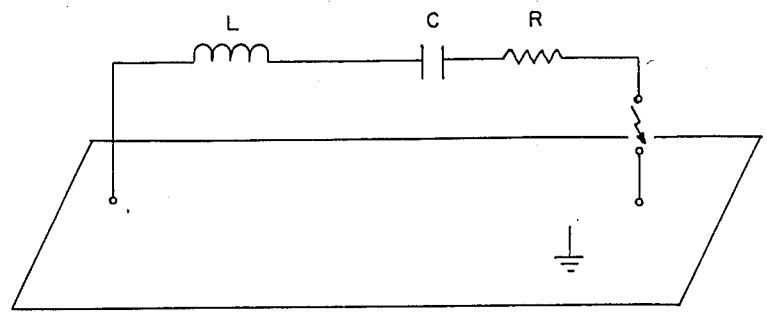
FIGS. 5A and 5B illustrate the difference between a parallel plate capacitor circuit and a chargeable member circuit.

The difference between the use of metal objects as capacitances and a conventional parallel plate capacitor is now to be reviewed. In the context of FIG. 2A, the chargeable member 20 is the metal object while the capacitance C1 is a paralled plate capacitor. A parallel plate capacitor is only one geometry of capacitance. It requires a wired return current path such as illustrated in FIG. 5A. The wired return current path, whose inductance is estimated at 500 nanohenries per foot, limits the speed with which the capacitor C can discharge.

Figure 5B:
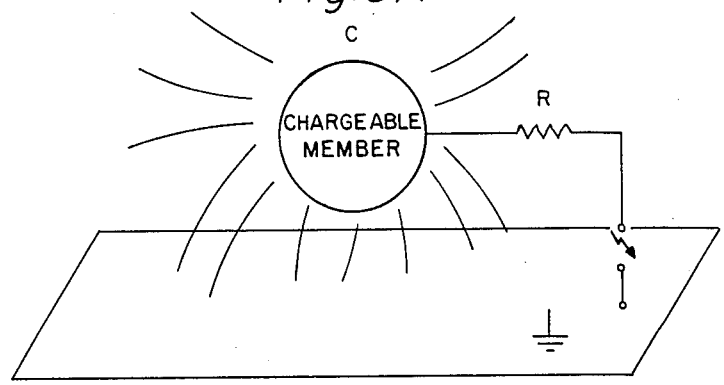

By contrast, as illustrated in FIG. 5B, a large surface area of metal creates a stored field in the space around it. Some of these filed lines terminated at nearby metal objects such as the floor beneath it. Other field lines terminate on the ceiling and other objects farther away. Essentially, a capacitor is formed between the metal object and all these other objects, and the currents no longer have to pass through a narrow channeled wire. This eliminates inductance associated with the wire and permits far faster rise times in the circuit.

Figure 6:
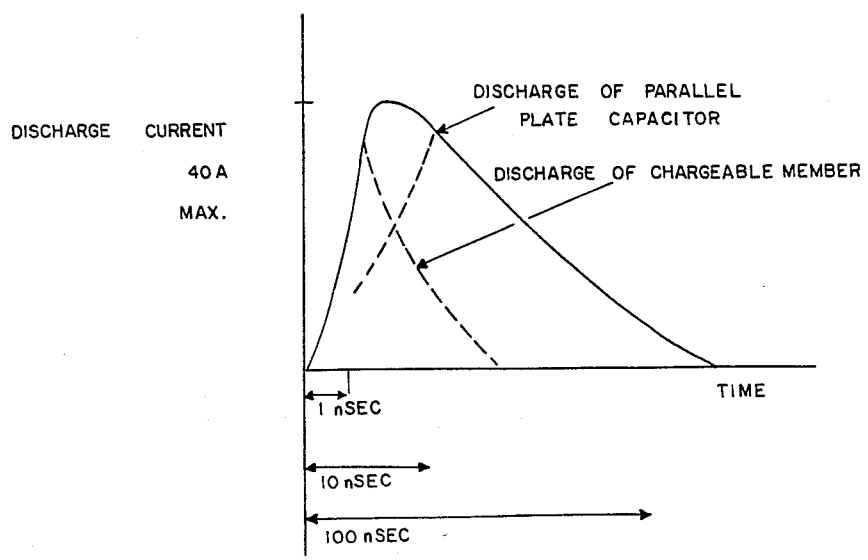
FIG. 6 is a waveform associated with the simulator of this invention.

Unfortunately, the standards such as IEC 801-2 (1984) call for capacitances on the order of 150 picofarads. This can only be simulated by inordinately large objects. Therefore, in accordance with the invention, there is provided for the combination of the capacitance of a metal object which is called herein a "chargeable member," with that of a parallel plate capacitor to produce a composite circuit as illustrated in FIG. 2B. In this circuit, an initial spark is formed by the capacitance of the chargeable member discharging through resistance R2. Then a slower waveform is produced by the action of capacitor C1 and resistance R2. The composite waveform produced is illustrated in FIG. 6. Note in FIG. 6 that the final waveform in solid is actually a composite of the discharge waveforms of both the parallel plate capacitor and the chargeable member.

Figure 4:
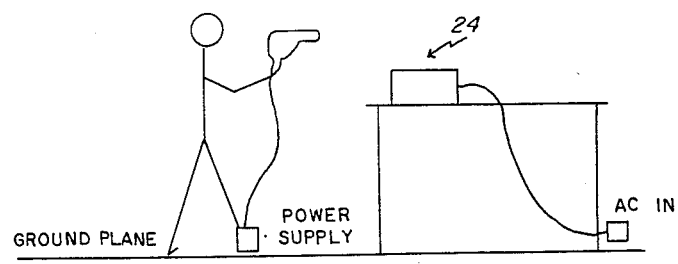
FIG. 4 schematically illustrates a test setup.

Reference is also now made to the schematic waveform of FIG. 4 that illustrates an operator handling the simulator which in turn is coupled to a high voltage supply. FIG. 4 also illustrates a computer or other electronic equipment at 24 as powered from an AC source.

Now, in accordance with the invention, there is provided an ESD simulation circuit which is comprised of the circuit elements illustrated in FIG. 2B. A voltage supply 10 supplies between 5 and 25 kilovolts of voltage through charging resistance R1. The value of R1 is between 100 megaohms and 1 gigaohm. A single pole double throw or double pole double throw switch is used to alternately charge and discharge capacitance C1. Note in FIG. 2A the switch contacts S1 and S2 which operate in a mutually exclusive manner. S1 closes to charge capacitor C1 and S2 closes to discharge capacitor C1.

The stray inductance L is an unavoidable circuit parameter. When switch S2 is closed and the probe tip brought near a metal object like the case of a computer, an initial, very fast waveform is produced by the capacitance of the chargeable member and resistance R2. A slower waveform then adds to this initial waveform that is produced by the combination of capacitor C1 and resistor R2. The value of the chargeable member capacitance is chosen to swamp the upper limit of the inductance of the stray inductor L.

A preferred embodiment of the present invention is illustrated in the block diagram of FIG. 7. FIG. 7 implements the concepts of FIG. 2B and furthermore incorporates the use of an event detector 30 to be described in further detail hereinafter.

In FIG. 7 a high voltage supply 10 charges the chargeable member 20 which forms part of the overall probe as illustrated at 25. FIG. 7 also shows the replaceable tip 26 and the series resistance R2.

In the previous embodiment of FIG. 2B, it is noted that switches are used for charging and discharging the capacitor. However, in FIG. 7 an alternate arrangement is provided for charging and discharging the capacitor C1. The capacitor C1 may be a 140 picofarad capacitor. For this purpose, there is provided the event detector 30 which is used to turn off the high voltage supply 10 when a spark has been detected. The purpose of this arrangement is to replace the switches S1 and S2 in FIG. 2B. Switches built to accommodate voltages up to 25 kilovolts are quite expensive, and therefore this alternative is employed.

The circuit of FIG. 7 operates as follows. When current begins to flow through capacitor C1, a voltage transient appears at the input of the event detector at input line 31. This voltage transient then keys a relay (not shown) which turns off the high voltage supply 10. Note the control line 32 in FIG. 7 coupling from the event detector 32 to the high voltage supply 10.

The high voltage supply 10 is re-energized by pressing the reset button 34 which provides a reset signal by way of line 35 to the event detector 30. This resets the event detector so that the signal on line 32 no longer holds the high voltage supply off. In this way, the high voltage supply 10 can then charge capacitor C1 and keep it continuously charged to prevent loss due to leakage currents in capacitor C1. Once a high voltage arc is detected causing a voltage transient through capacitor C1, then once again the high voltage supply 10 is turned off.

Unfortunately, detecting an electrostatic event is difficult due to the range of currents involved. Depending on the load condition, currents produced by electrostatic events can range from microamps to amps. This wide dynamic range limits the capability of most conventional event detectors.

Another novel aspect of the present invention is the event detector, a particular embodiment of which is illustrated in FIG. 8A. Of particular interest in FIG. 8A is the RC network for generating the signal VX. This is the signal that controls the high voltage supply 10. In FIG. 8A switches S1 and S2 are illustrated. However, it is understood that such switching arrangements may be replaced by conductors in which case the high voltage supply 10 is thus controlled from the signal VX.

The capacitor C1 in FIG. 7 is essentially replaced in FIG. 8A by several capacitors identified in FIG. 8 as capacitor C coupled in series. Resistances R permit the distribution of DC potentials across these capacitors to be equal. Note in FIG. 8A that a single resistor R couples in parallel with each of the individual capacitors C. As in the case of high voltage switches and relays, high voltage capacitors are difficult and expensive to acquire, and therefore the use of a bank of capacitors as shown in FIG. 8A is preferred. The event detection occurs at the point of the circuit where the signal VX is derived. To understand the application, the following is now considered.

Assume first that the values of RE and CE in FIG. 8A are equal to R and C, respectively. In this case, the impedance of RE and CE in parallel ($Z_1$) equals $$Z_1 = \frac{R}{(1 - R^2 W^2 C^2)^{\frac{1}{2}}} \quad (1)$$

$$RE = R$$

$$CE = C$$

$$W = 2\pi f$$

$$f = \text{frequency in } HZ$$

If (RE)(CE) equals RC, then the voltage VX is simply one fourth of voltage VC.

If, however, we choose differing values for RE and CE from R and C, the signal VX differs as well. For example, if RE=R/100 and CE=C×100, then the circuit acts as an attenuator with the same frequency characteristics as when RE=R and CE=C. In this case, the impedance of RE and CE ($Z_2$) would be $$Z_2 = \frac{\frac{R}{100}}{(1 - R^2 W^2 C^2)^{\frac{1}{2}}} = Z_1/100 \quad (2)$$

$$RE = R/100$$

$$CE = C \times 100$$

Consider next the case where RE=R, but CE=100C. In this case, the impedance of RE and CE would be $Z_3$ $$Z_3 = \frac{R}{(1 - R^2 W^2 C^2 (10^4))^{\frac{1}{2}}} \quad (3)$$

$$RE = R$$

$$CE = 100C$$

Note that, at low frequencies, $Z_3 = Z_1$. However, at high frequencies, $Z_3 = Z_1/100$ $$\text{where } W << \frac{1}{100 RC} \quad Z_3 = R \quad (4)$$

$$\text{where } W >> \frac{1}{100 RC} \quad Z_3 = \frac{Z_1}{100} \quad (5)$$

Therefore, if CE=100C, and RE=$R_1$, VX varies as shown in the lower graph of FIG. 8C when charging and discharging the circuit. Its charging time constant is longer due to the larger capacitance CE. On discharge, however, there is a rapid step in the waveform which is equal to $$V_{step} = \frac{V}{4}\left(1 - \frac{C}{CE}\right)$$

Note that the rapid step is not a function of the current flowing through the capacitances. Therefore, its amplitude is immune to the wide variation in currents due to ESD currents.

The functioning of the event detector can be thought of as follows. At low frequenices, the voltages divide equally among all the resistances, since RE equals R (see FIG. 8B). At high frequencies, however, the voltages do not divide equally, since CE is one hundred times C (see FIG. 8C). This is reflected as a step in the waveform.

Therefore, in a summary of the invention, there is provided an electrostatic discharge generator using a chargeable member hooked in parallel with a parallel plate capacitor. The chargeable member is kept continually charged by a high voltage supply through a charging resistance greater than 100 megaohms. A specially designed bank of resistors and capacitors produces a voltage step simultaneous with an ESD event which is independent of current and detected by an event detector. This event detector turns off the high voltage supply. To charge the capacitances for the next event, the event detector is reset using a reset switch built into the probe.

The event detector is designed as follows. A multiplicity of capacitors are wired in series, each capacitance being paralleled by a resistance. These resistances, so as not to lower the output of the high voltage supply, are to be greater than one gigaohm. A time constant is created by each RC combination. To produce an event detector, a combination of two additional components, RE and CE in parallel, is chosen so that RE×CE is much greater than RC. This produces a stepped event upon an electrostatic discharge which is independent of current and can be detected by differentiation.

Having now described a limited number of embodiments of the present invention, it should now be apparent to those skilled in the art that numerous other embodiments and modifications thereof are contemplated as falling within the scope of the present invention as defined by the appended claims.

What is claimed is:

1. An electrostatic discharge simulator comprising, a high voltage source, a parallel plate capacitor means, first switch means, means connecting the high voltage source in a series loop with the first switch means and capacitor means for enabling charging of said capacitor means upon closure of said first switch means, a chargeable member, second switch means, an output terminal, and means connecting the second switch means in series with the chargeable member between said parallel plate capacitor means nad output terminal, said second switch means, upon closure, providing an output pulse at said output terminal, said capacitor means comprising a plurality of series connected capacitors, and a resistor in parallel with each said capacitor.

2. An electrostatic discharge simulator comprising, a high voltage source, a parallel plate capacitor means, first switch means, means connecting the high voltage source in a series loop with the first switch means and capacitor means for enabling charging of said capacitor means upon closure of said first switch means, a chargeable member, second switch means, an output terminal, and means connecting the second switch means in series with the chargeable member between said parallel plate capacitor means nad output terminal, said second switch means, upon closure, providing an output pulse at said output terminal, said chargeable member comprising a metal sphere.

3. An electrostatic discharge simulator comprising, a high voltage source, a parallel plate capacitor means, first switch means, means connecting the high voltage source in a series loop with the first switch means and capacitor means for enabling charging of said capacitor means upon closure of said first switch means, a chargeable member, second switch means, an output terminal, and means connecting the second switch means in series with the chargeable member between said parallel plate capacitor means nad output terminal, said second switch means, upon closure, providing an output pulse at said output terminal, said chargeable member comprising a single metal plate.

* * * * *